US012701692B2

(12) United States Patent
Adachi et al.

(10) Patent No.: US 12,701,692 B2
(45) Date of Patent: Aug. 4, 2026

(54) SEMICONDUCTOR STRUCTURE AND FORMING METHOD AND OPERATING METHOD THEREFOR

(71) Applicant: Changxin Memory Technologies, Inc., Hefei (CN)

(72) Inventors: Takao Adachi, Hefei (CN); Xiaoguang Wang, Hefei (CN); Deyuan Xiao, Hefei (CN); Soonbyung Park, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 317 days.

(21) Appl. No.: 18/511,808

(22) Filed: Nov. 16, 2023

(65) Prior Publication Data

US 2024/0098975 A1     Mar. 21, 2024

Related U.S. Application Data

(63) Continuation of application No. PCT/CN2022/133651, filed on Nov. 23, 2022.

(30) Foreign Application Priority Data

Sep. 15, 2022     (CN) .......................... 202211120748.6

(51) Int. Cl.
H10B 12/00          (2023.01)

(52) U.S. Cl.
CPC ....... H10B 12/315 (2023.02); H10B 12/0335 (2023.02); H10B 12/482 (2023.02); H10B 12/488 (2023.02); H10B 12/50 (2023.02)

(58) Field of Classification Search
CPC ... H10B 12/315; H10B 12/482; H10B 12/488
See application file for complete search history.

(56) References Cited

U.S. PATENT DOCUMENTS

| 6,982,897 B2 | 1/2006 | Luk et al. |
| 8,441,053 B2 | 5/2013 | Chen et al. |
| | (Continued) | |

FOREIGN PATENT DOCUMENTS

| CN | 112397645 A | 2/2021 |
| CN | 112466892 A | 3/2021 |
| | (Continued) | |

OTHER PUBLICATIONS

PCT International Search Report and the Written Opinion mailed Mar. 30, 2023, issued in related International Application No. PCT/CN2022/133651, with partial English translation (9 pages).

*Primary Examiner* — Steven M Page
(74) *Attorney, Agent, or Firm* — Sheppard Mullin Richter & Hampton LLP

(57)          ABSTRACT

A semiconductor structure includes: a substrate; a memory array, including a plurality of storage cells arranged in a first direction and a second direction, where each storage cell includes an active pillar including a first channel region and a second channel region that are arranged at intervals in a third direction; a word line structure, including a first word line extending in the first direction and a second word line extending in the second direction, where the first word line covers the first channel regions of the active pillars of the plurality of storage cells that are arranged at intervals in the first direction, and the second word line covers the second channel regions of the active pillars of the plurality of storage cells that are arranged at intervals in the second direction; and a common bit line, electrically connected to all the storage cells in the memory array.

20 Claims, 9 Drawing Sheets

(56)                    References Cited

U.S. PATENT DOCUMENTS

| | | | |
|---|---|---|---|
| 10,978,485 B2 | 4/2021 | Lue | |
| 11,063,218 B2 | 7/2021 | Jung et al. | |
| 2022/0172766 A1 | 6/2022 | Matsuzaki et al. | |
| 2022/0285353 A1* | 9/2022 | Cho | H10B 12/05 |

FOREIGN PATENT DOCUMENTS

| | | | | |
|---|---|---|---|---|
| CN | 110503996 B | | 8/2021 | |
| CN | 113903735 A | * | 1/2022 | H10B 12/03 |
| CN | 115020410 A | | 9/2022 | |
| CN | 116033741 A | | 4/2023 | |

* cited by examiner

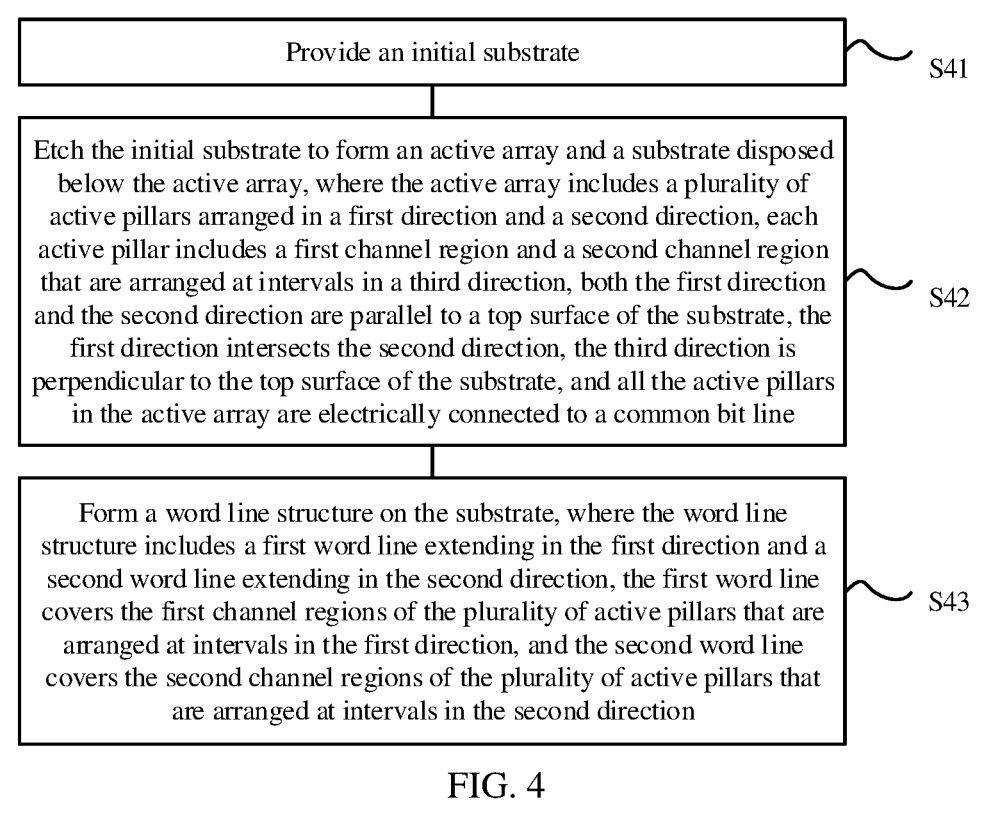

| | |
|---|---|
| Provide an initial substrate | S41 |

| | |
|---|---|
| Etch the initial substrate to form an active array and a substrate disposed below the active array, where the active array includes a plurality of active pillars arranged in a first direction and a second direction, each active pillar includes a first channel region and a second channel region that are arranged at intervals in a third direction, both the first direction and the second direction are parallel to a top surface of the substrate, the first direction intersects the second direction, the third direction is perpendicular to the top surface of the substrate, and all the active pillars in the active array are electrically connected to a common bit line | S42 |

| | |
|---|---|
| Form a word line structure on the substrate, where the word line structure includes a first word line extending in the first direction and a second word line extending in the second direction, the first word line covers the first channel regions of the plurality of active pillars that are arranged at intervals in the first direction, and the second word line covers the second channel regions of the plurality of active pillars that are arranged at intervals in the second direction | S43 |

FIG. 4

SEMICONDUCTOR STRUCTURE AND FORMING METHOD AND OPERATING METHOD THEREFOR

CROSS-REFERENCE TO RELATED APPLICATIONS

This application is a continuation application of International Patent Application No. PCT/CN2022/133651, filed on Nov. 23, 2022, which claims priority to Chinese Patent Application No. 202211120748.6, filed on Sep. 15, 2022, and entitled "SEMICONDUCTOR STRUCTURE AND FORMING METHOD AND OPERATING METHOD THEREFOR." The above-referenced applications are incorporated herein by reference in their entirety.

TECHNICAL FIELD

The present invention relates to the field of semiconductor manufacturing technologies, and in particular, to a semiconductor structure and a forming method and an operating method therefor.

BACKGROUND

In semiconductor structures such as dynamic random access memory (DRAM) or magnetoresistive random access memory (MRAM), the word line and the bit line define the location of the storage cell. Therefore, a plurality of densely arranged word lines and bit lines need to be disposed in the semiconductor structure. As the feature size of the semiconductor structures continues to decrease, the space used to form bit lines becomes increasingly smaller, making it more challenging to form the bit lines in the reduced space. In addition, in the semiconductor structures, two bit lines typically share one sense amplifier (SA). The dense arrangement of the bit lines requires the deposition of a plurality of sense amplifiers, thereby increasing the area occupied by the sense amplifiers and limiting further reduction of the size of the semiconductor structures.

Therefore, improving the internal space utilization of the semiconductor structures, reducing the area occupied by the sense amplifier, and simplifying the manufacturing process of the semiconductor structures are urgent technical issues to be addressed at present.

SUMMARY

In some embodiments of the present invention, a semiconductor structure and a forming method and an operating method therefor are provided to improve the internal space utilization of the semiconductor structure, contribute to further downsizing of the semiconductor structure, simplify the manufacturing process of the semiconductor structure, and reduce the manufacturing costs of the semiconductor structure.

According to some embodiments, the present invention provides a semiconductor structure, including: a substrate; a memory array, disposed on the substrate and including a plurality of storage cells arranged in a first direction and a second direction, where each storage cell includes an active pillar, the active pillar includes a first channel region and a second channel region that are arranged at intervals in a third direction, both the first direction and the second direction are parallel to a top surface of the substrate, the first direction intersects the second direction, and the third direction is perpendicular to the top surface of the substrate; a word line structure, disposed on the substrate and including a first word line extending in the first direction and a second word line extending in the second direction, where the first word line covers the first channel regions of the active pillars of the plurality of storage cells that are arranged at intervals in the first direction, and the second word line covers the second channel regions of the active pillars of the plurality of storage cells that are arranged at intervals in the second direction; and a common bit line, disposed on the substrate and electrically connected to all the storage cells in the memory array.

In some embodiments, the active pillar further includes: a common source/drain region, disposed between the first channel region and the second channel region; a first source/drain region, disposed on a side of the first channel region away from the common source/drain region; and a second source/drain region, disposed on a side of the second channel region away from the common source/drain region.

In some embodiments, a material of the active pillar is a semiconductor material including doped ions, and an ion doping concentration of the common source/drain region is greater than each of an ion doping concentration of the first channel region and an ion doping concentration of the second channel region.

In some embodiments, the common bit line is in a flat plate shape, and a projection of the common bit line in the flat plate shape on the top surface of the substrate covers a projection of the memory array on the top surface of the substrate.

In some embodiments, the second source/drain region is disposed above the first source/drain region in the third direction; and the storage cell further includes: a storage element, where the storage element is disposed above the second source/drain region and is electrically connected to the second source/drain region.

In some embodiments, the common bit line is disposed above the memory array in the third direction; and the storage element includes: a first end, electrically connected to the second source/drain region; and a second end, disposed above the first end in the third direction, and electrically connected to the common bit line.

In some embodiments, the storage cell further includes: a bottom contact electrode, disposed between the first end and the second source/drain region, where the bottom contact electrode is electrically connected to the first end and the second source/drain region, and covers the second source/drain region.

In some embodiments, the semiconductor structure further includes: a common source line, disposed below the memory array in the third direction, where the first source/drain regions of all the storage cells in the memory array are electrically connected to the common source line.

In some embodiments, the common source line is in a flat plate shape, and a projection of the common source line in the flat plate shape on the top surface of the substrate covers a projection of the memory array on the top surface of the substrate.

In some embodiments, the storage element is a capacitor, and the common bit line is disposed below the memory array in the third direction; and the capacitor includes: a lower electrode layer, electrically connected to the second source/drain region; a dielectric layer, covering a surface of the lower electrode layer; and an upper electrode layer, covering a surface of the dielectric layer.

In some embodiments, a plurality of first word lines are arranged at intervals in the second direction, and a plurality of second word lines are arranged at intervals in the first direction.

In some embodiments, the semiconductor structure further includes: a sense amplifier, disposed outside the memory array and electrically connected to the common bit line.

According to some other embodiments, the present invention further provides a method for forming a semiconductor structure, including: providing an initial substrate; etching the initial substrate to form an active array and a substrate disposed below the active array, where the active array includes a plurality of active pillars arranged in a first direction and a second direction, the active pillar includes a first channel region and a second channel region that are arranged at intervals in a third direction, both the first direction and the second direction are parallel to a top surface of the substrate, the first direction intersects the second direction, the third direction is perpendicular to the top surface of the substrate, and all the active pillars in the active array are electrically connected to a common bit line; and forming a word line structure on the substrate, where the word line structure includes a first word line extending in the first direction and a second word line extending in the second direction, the first word line covers the first channel regions of the plurality of active pillars that are arranged at intervals in the first direction, and the second word line covers the second channel regions of the plurality of active pillars that are arranged at intervals in the second direction.

In some embodiments, forming the active array includes: etching the initial substrate to form a plurality of first trenches that extend in the first direction and are arranged at intervals in the second direction, and a plurality of second trenches that extend in the second direction and are arranged at intervals in the first direction, where the plurality of first trenches and the plurality of second trenches define, on the initial substrate, the plurality of active pillars arranged in the first direction and the second direction.

In some embodiments, the active pillar includes a common source/drain region disposed between the first channel region and the second channel region, a first source/drain region disposed on a side of the first channel region away from the common source/drain region, and a second source/drain region disposed on a side of the second channel region away from the common source/drain region, and the second source/drain region is disposed above the first source/drain region in the third direction, and where forming the word line structure on the substrate includes: filling a first isolation material in the first trenches and the second trenches to form a first isolation layer that fills the first trenches and the second trenches; etching back the first isolation layer to form a plurality of third trenches that extend in the first direction and are arranged at intervals in the second direction, where the third trenches expose the first channel regions of the active pillars of a plurality of storage cells that are arranged at intervals in the first direction; forming a first gate dielectric layer wrapping the first channel region along the third trench, and forming the first word line covering the first gate dielectric layer; forming a second isolation layer that covers the first word line and fills the third trenches; etching back the second isolation layer to form a plurality of fourth trenches that extend in the second direction and are arranged at intervals in the first direction, where the fourth trenches expose the second channel regions of the active pillars of a plurality of storage cells that are arranged at intervals in the second direction; and forming a second gate dielectric layer wrapping the second channel region along the fourth trench, and forming the second word line covering the second gate dielectric layer.

In some embodiments, after forming the word line structure on the substrate, the method further includes: forming a storage element above the second source/drain region, where the storage element is electrically connected to the second source/drain region.

In some embodiments, forming the storage element above the second source/drain region includes: forming, on the second source/drain region, a first end that is electrically connected to the second source/drain region; and forming a second end above the first end to form the storage element including the first end and the second end, where the second end is configured to electrically connect to the common bit line.

In some embodiments, before forming, on the second source/drain region, the first end that is electrically connected to the second source/drain region, the method further includes: forming a bottom contact electrode covering the second source/drain region, where the bottom contact electrode covers the second source/drain region.

In some embodiments, after forming the storage element above the second source/drain region, the method further includes: forming, above the storage element in the third direction, the common bit line electrically connected to the second end of the storage element.

In some embodiments, forming, above the storage element in the third direction, the common bit line electrically connected to the second end of the storage element includes: forming a bit line contact plug above the second end of each storage element; and forming the common bit line that is electrically connected to all bit line plugs and is in a flat plate shape, where the projection of the common bit line in the flat plate shape on the top surface of the substrate covers the projection of the active array on the top surface of the substrate.

In some embodiments, the method further includes: forming a common source line in a flat plate shape below the active array, where the common source line is electrically connected to the first source/drain region, and the projection of the common source line in the flat plate shape on the top surface of the substrate covers the projection of the active array on the top surface of the substrate.

In some embodiments, forming the active array and the substrate disposed below the active array includes: etching the initial substrate to form the plurality of first trenches and the plurality of second trenches, where the plurality of first trenches and the plurality of second trenches define, on the initial substrate, the plurality of active pillars arranged in the first direction and the second direction, a portion of the initial substrate remaining below the active pillars is configured as the common source line, and a portion of the initial substrate remaining below the common source line is configured as the substrate.

In some embodiments, the storage element is a capacitor; and forming the active array and the substrate disposed below the active array further includes: etching the initial substrate to form the plurality of first trenches and the plurality of second trenches, where the plurality of first trenches and the plurality of second trenches define, on the initial substrate, the plurality of active pillars arranged in the first direction and the second direction, a portion of the initial substrate remaining below the active pillars forms the common bit line in a flat plate shape, a portion of the initial substrate remaining below the common bit line is configured as the substrate, the common bit line is electrically connected to the first source/drain region, and the projection of the common bit line in the flat plate shape on the top surface of the substrate covers the projection of the active array on the top surface of the substrate.

In some embodiments, the material of the active pillar is a semiconductor material including doped ions, and an ion doping concentration of the common source/drain region is greater than each of an ion doping concentration of the first channel region and an ion doping concentration of the second channel region.

According to still some other embodiments, the present invention further provides a method for operating a semiconductor structure, including the following steps: providing the semiconductor structure described above; and applying a first enable signal to a first word line, applying a second enable signal to a second word line, and performing, through the common bit line, a read operation or a write operation on a storage cell that is identified by the first word line and the second word line.

According to the semiconductor structure and the forming method and operating method therefor provided in some embodiments of the present invention, a first channel region and a second channel region that are arranged at intervals are disposed in the active pillar of a storage cell along the extension direction of the active pillar, a word line structure including a first word line and a second word line is disposed, and each storage cell is connected to one first word line and one second word line. This allows the determination of the position of a storage cell in a memory array by using the first word line and the second word line. Therefore, only one common bit line is disposed in the memory array, which is electrically connected to all storage cells in the memory array. On the one hand, the manufacturing process of the bit line is simplified, the area of the bit line is increased, and the resistance of the bit line is reduced, thereby improving the electrical performance of the semiconductor structure. On the other hand, because only one common bit line is disposed, the number of sense amplifiers can be greatly reduced, and the area occupied by the sense amplifier can be reduced. Consequently, this improves the internal space utilization of the semiconductor structure and contributes to further downsizing of the semiconductor structure. In some other embodiments of the present invention, a common source line in a flat plate shape may be formed, thereby further simplifying the manufacturing process of the semiconductor structure.

BRIEF DESCRIPTION OF DRAWINGS

FIG. 4 is a flowchart of a method for forming a semiconductor structure according to some embodiments of the present invention;

DESCRIPTION OF EMBODIMENTS

Some embodiments of a semiconductor structure and a forming method and an operating method therefor provided in the present invention are described in detail below with reference to the accompanying drawings.

Figure 1:
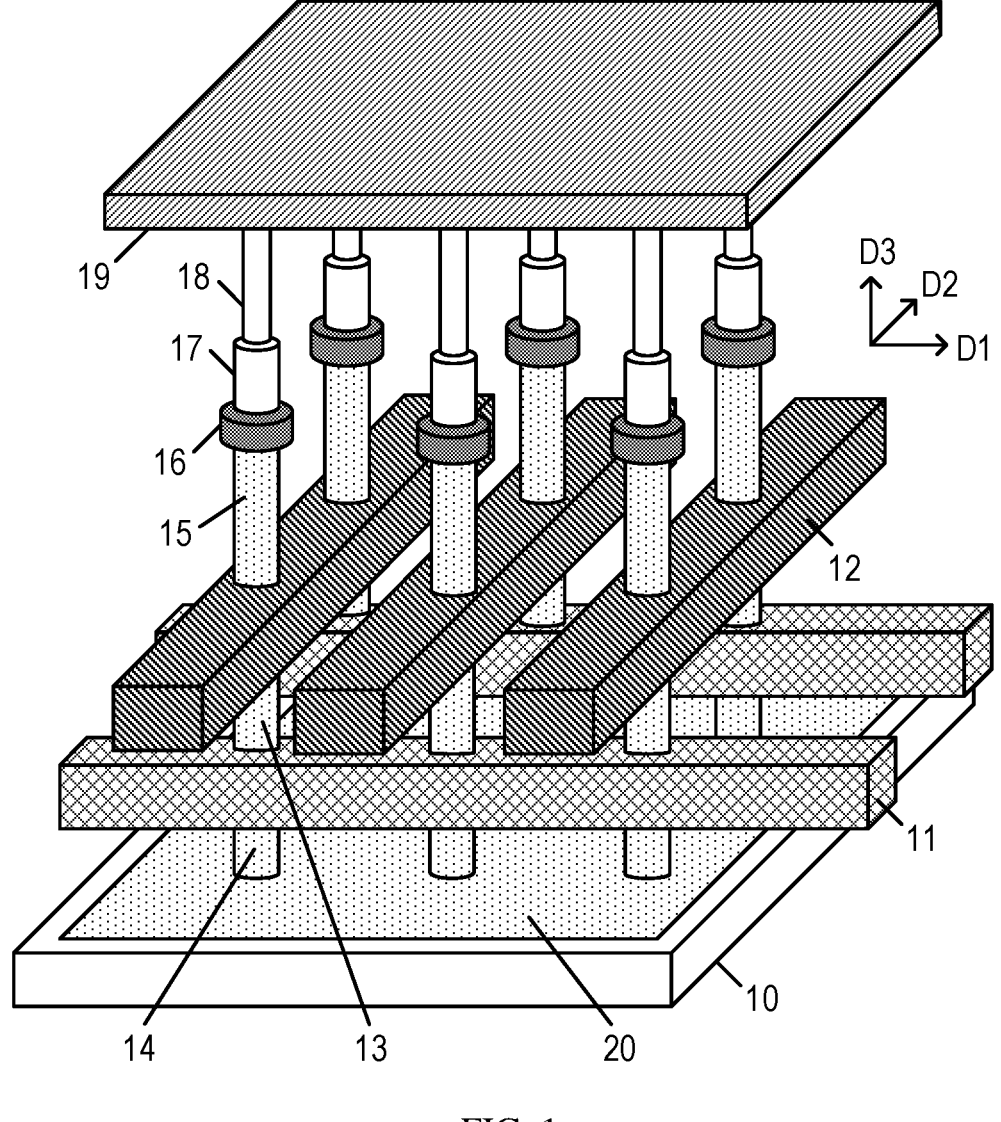
FIG. 1 is a schematic structural diagram of a semiconductor structure according to some embodiments of the present invention.
Figure 2:
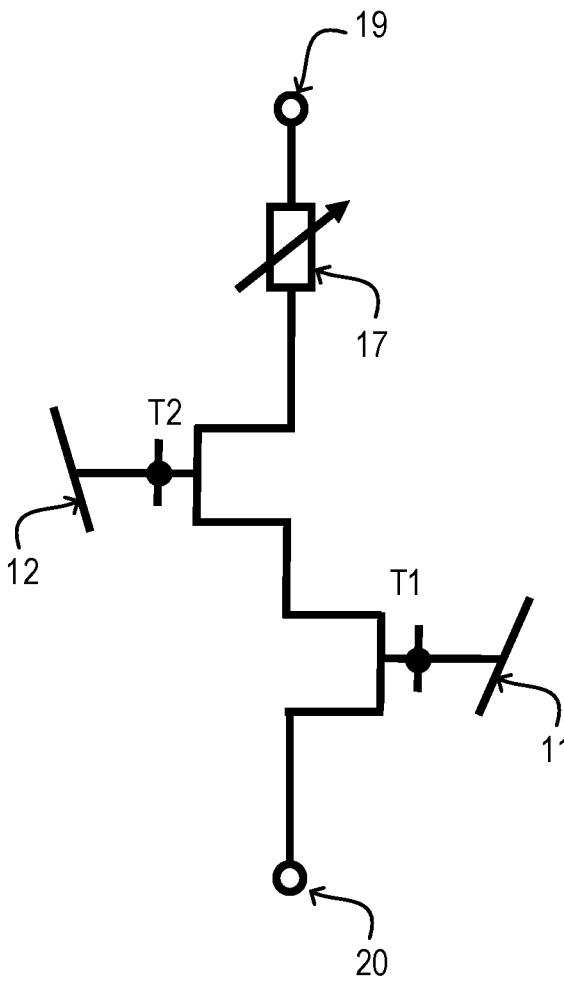
FIG. 2 is a schematic circuit diagram of a semiconductor structure according to some embodiments of the present invention.

This invention provides a semiconductor structure. FIG. 1 is a schematic structural diagram of a semiconductor structure according to some embodiments of the present invention. FIG. 2 is a schematic circuit diagram of a semiconductor structure according to some embodiments of the present invention. As shown in FIG. 1 and FIG. 2, the semiconductor structure includes: a substrate 10; a memory array, disposed on the substrate 10 and including a plurality of storage cells arranged in a first direction D1 and a second direction D2, where each storage cell includes an active pillar, the active pillar includes a first channel region and a second channel region that are arranged at intervals in a third direction D3, both the first direction D1 and the second direction D2 are parallel to a top surface of the substrate 10, the first direction D1 intersects the second direction D2, and the third direction D3 is perpendicular to the top surface of the substrate 10; a word line structure, disposed on the substrate 10 and including a first word line 11 extending in the first direction D1 and a second word line 12 extending in the second direction D2, where the first word line 11 covers the first channel regions of the active pillars of the plurality of storage cells that are arranged at intervals in the first direction D1, and the second word line 12 covers the second channel regions of the active pillars of the plurality of storage cells that are arranged at intervals in the second direction D2; and a common bit line 19, disposed on the substrate 10 and electrically connected to all the storage cells in the memory array.

In some embodiments, the semiconductor structure may be, but is not limited to, a DRAM, an MRAM, a resistive random access memory (RRAM), a phase-change random access memory (PCRAM), a ferroelectric random access memory (FeRAM), or the like. The substrate 10 may be, but is not limited to, a silicon substrate. In some embodiments, an example in which the substrate 10 is a silicon substrate is used for description. In some other embodiments, the substrate 10 may alternatively be a semiconductor substrate such as gallium nitride, gallium arsenide, gallium carbide, silicon carbide, or silicon on insulator (SOI). The substrate is configured to form or support a device structure such as the memory array on the substrate. In some embodiments, the top surface of the substrate 10 is a surface of the substrate 10 facing the memory array. In some embodiments, "a plurality of" means two or more.

The memory array includes a plurality of storage cells that are arranged in a two-dimensional array in the first direction D1 and the second direction D2, and each storage cell includes an active pillar and a storage element. The active pillar is disposed on the substrate 10 and extends in the third direction D3. The channel structure in the active pillar includes the first channel region and the second channel region that are arranged at intervals in the third direction D3, and the first channel region and the second channel region are electrically connected to each other through a part of the active pillar (that is, a common source/drain region described later) between the first channel region and the second channel region, so that the storage cell includes a first transistor and a second transistor that are connected in series. The first transistor includes the first channel region, and the second transistor includes the second channel region. The part of the first word line 11 covering the first channel region is configured as a first gate of the first transistor, and the part of the second word line 12 covering the second channel region is configured as a second gate of the second transistor. When a first enable signal is transmitted to the first transistor in the storage cell through the first word line 11, and at the same time, a second enable signal is transmitted to the second transistor in the same storage cell through the second word line 12, the first transistor and the second transistor in the storage cell are simultaneously turned on, so that a read/write operation can be performed on the storage cell. For the first word line 11 and the second word line 12 that are electrically connected to the same storage cell, if only the first word line 11 transmits the first enable signal to the first transistor in the storage cell, or if only the second word line 12 transmits the second enable signal to the second transistor in the storage cell, then only the first transistor in the storage cell is turned on or only the second transistor in the storage cell is turned on. In such cases, a read/write operation cannot be performed on the storage cell. In some embodiments, the storage cell in the memory array is selected through the first word line 11 and the second word line 12. Therefore, it's possible to form only one common bit line 19 without the need to dispose one bit line for each row of storage cells. This reduces the number of bit lines, lowers the difficulty in the manufacturing process of the bit line, and reduces the number of sense amplifiers that are configured to amplify a bit line signal in a peripheral circuit. Consequently, this saves the space inside the semiconductor structure, increases the integration level of the semiconductor structure, and contributes to further downsizing of the semiconductor structure.

In some embodiments, the storage cell further includes: a common source/drain region 13, disposed between the first channel region and the second channel region; a first source/drain region 14, disposed on a side of the first channel region away from the common source/drain region 13; and a second source/drain region 15, disposed on a side of the second channel region away from the common source/drain region 13.

In some embodiments, the material of the active pillar is a semiconductor material including doped ions, and the ion doping concentration of the common source/drain region 13 is greater than each of the ion doping concentration of the first channel region and the ion doping concentration of the second channel region.

For example, as shown in FIG. 1, the active pillar may be a silicon pillar that extends in the third direction D3, and the material of the silicon pillar is a silicon material that includes the doped ions. In some embodiments, the doped ions may be N-type ions, or may be P-type ions. The silicon pillar includes the first source/drain region 14, the first channel region, the common source/drain region 13, the second channel region, and the second source/drain region 15 that are sequentially arranged in the third direction D3. The ion doping concentration of the common source/drain region 13 is greater than the ion doping concentration of the channel structure to enhance conductivity of the common source/drain region 13. In some embodiments, the ion doping concentration of the common source/drain region 13 may be equal to each of the ion doping concentration of the first source/drain region 14 and the ion doping concentration of the second source/drain region 15 to simplify the ion doping operation of the silicon pillar.

The length of the common source/drain region 13 in the third direction D3 should not be excessively short. Otherwise, there will be a relatively strong parasitic capacitance effect between the first word line 11 and the second word line 12 that are electrically connected to the same storage cell, resulting in current leakage. The length of the common source/drain region 13 in the third direction D3 should not be excessively long. Otherwise, the size of the storage cell will be excessively large. In some embodiments, the length of the common source/drain region 13 in the third direction D3 is, but is not limited to, 10 nm to 30 nm.

In some other embodiments, the material of the active pillar may alternatively be an oxide semiconductor material. The oxide semiconductor material may be any one of or a combination of at least two of $In_2O_3$ (indium oxide), ZnO (zinc oxide), IZO (indium zinc oxide), IGZO (indium gallium zinc oxide), IZTO (indium zinc tin oxide), and ZnON (zinc oxynitride). In some embodiments, the material of the active pillar is IGZO.

In some embodiments, the common bit line 19 is in a flat plate shape, and the projection of the common bit line 19 in the flat plate shape on the top surface of the substrate 10 covers the projection of the memory array on the top surface of the substrate 10. Using the common bit line 19 in the flat plate shape not only simplifies the manufacturing process of the common bit line 19 but also eliminates the need for aligning the common bit line 19 with each storage cell, thereby further simplifying the manufacturing process of the semiconductor structure. In addition, the area of the common bit line 19 can be increased, thereby reducing the resistance of the common bit line 19, and improving electrical performance of the semiconductor structure.

In some embodiments, the second source/drain region 15 is disposed above the first source/drain region 14 in the third direction D3; and the storage cell further includes: a storage element, where the storage element is disposed above the second source/drain region 15 and is electrically connected to the second source/drain region.

In some embodiments, the common bit line 19 is disposed above the memory array in the third direction D3; and the storage element includes: a first end, electrically connected to the second source/drain region 15; and a second end, disposed above the first end in the third direction D3, and electrically connected to the common bit line 19.

In some embodiments, the storage cell further includes: a bottom contact electrode 16, disposed between the first end and the second source/drain region 15, where the bottom contact electrode 16 is electrically connected to the first end and the second source/drain region 15, and covers the second source/drain region 15.

In some embodiments, the semiconductor structure further includes: a common source line 20, disposed below the memory array in the third direction D3, where the first source/drain regions 14 of all the storage cells in the memory array are electrically connected to the common source line 20.

In some embodiments, the common source line 20 is in a flat plate shape, and the projection of the common source line 20 in the flat plate shape on the top surface of the substrate 10 covers the projection of the memory array on the top surface of the substrate 10.

Specifically, the storage element including the first end and the second end may be a storage element in the MRAM (for example, a magnetic tunnel junction), a storage element in the RRAM, a storage element in the PCRAM, or a storage element in the FeRAM. The following description is based on an example in which the semiconductor structure is an MRAM, and the storage element in the storage cell is a magnetic tunnel junction element 17. For example, the magnetic tunnel junction element 17 includes a fixed layer (that is, the first end), an insulating layer, and a free layer (that is, the second end) that are sequentially arranged in the third direction D3. The fixing layer is electrically connected to the second source/drain region 15 through the bottom contact electrode 16. A bit line contact plug 18 is further disposed in the magnetic tunnel junction element 17 above the third direction D3. The bit line contact plug 18 extends in the third direction D3, one end of the bit line contact plug 18 is electrically connected to the free layer in the magnetic tunnel junction element 17, and the other end of the bit line contact plug 18 is electrically connected to the common bit line 19.

The semiconductor structure further includes the common source line 20 disposed below the memory array. Using the common source line 20 in the flat plate shape not only simplifies the manufacturing process of the common source line 20 but also eliminates the need for aligning common source line 20 with each storage cell, thereby simplifying the manufacturing process of the semiconductor structure. In addition, the common source line 20 in the flat plate shape can further increase the area of the common source line 20, thereby reducing the resistance of the common source line 20.

In some embodiments, the common source line 20 in the flat plate shape may have the same shape and size as the common bit line 19 in the flat plate shape, so that the common source line 20 and the common bit line 19 can be formed by using a same mask, thereby further reducing the number of masks and reducing manufacturing costs of the semiconductor structure.

Figure 3:
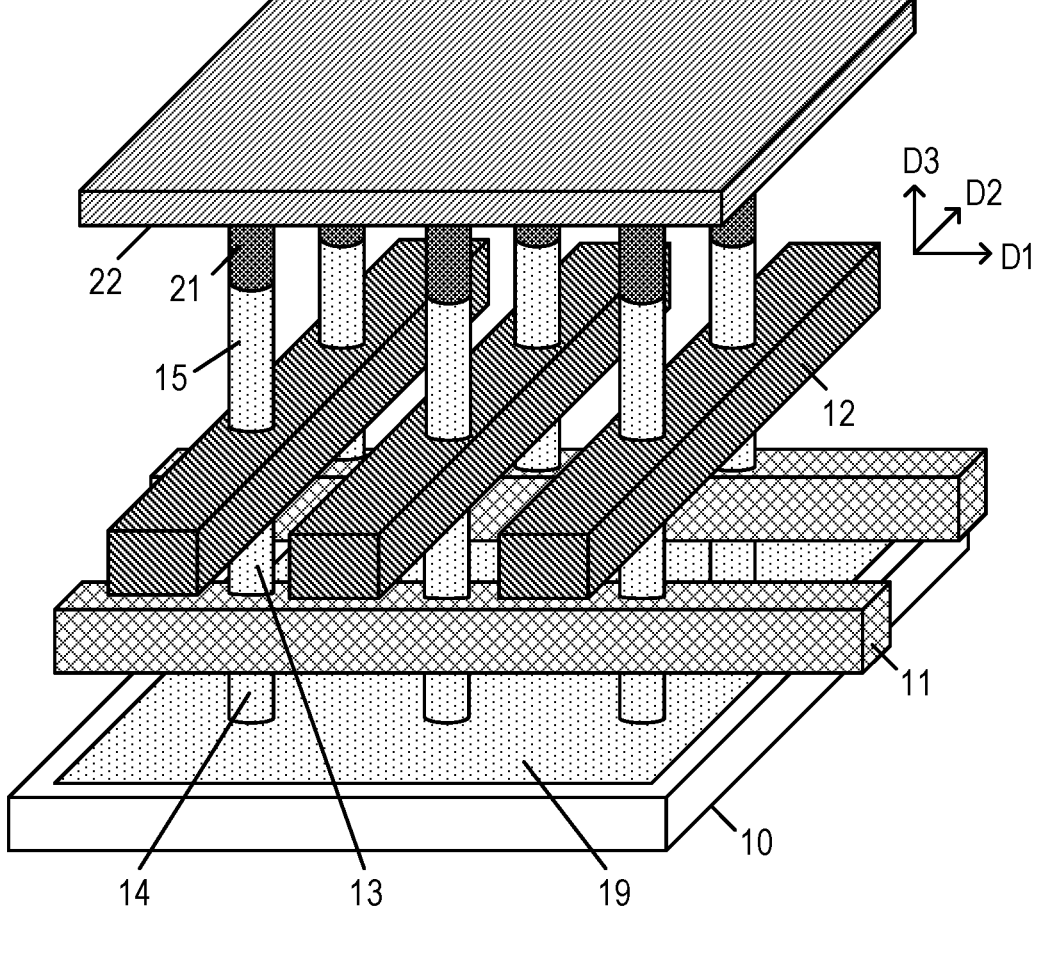
FIG. 3 is a schematic structural diagram of another semiconductor structure according to some embodiments of the present invention.

FIG. 3 is a schematic structural diagram of another semiconductor structure according to some embodiments of the present invention. In some embodiments, as shown in FIG. 3, the storage element is a capacitor 21, and the common bit line is disposed below the memory array in the third direction D3; and the capacitor 21 includes: a lower electrode layer, electrically connected to the second source/drain region 15; a dielectric layer, covering a surface of the lower electrode layer; and an upper electrode layer, covering a surface of the dielectric layer.

The following description is based on an example in which the semiconductor structure is a DRAM, and the storage element in the storage cell is the capacitor 21. For example, as shown in FIG. 3, the common bit line 19 in the flat plate shape is disposed below the memory array in the third direction D3, and is electrically connected to the first source/drain regions 14 in all the storage cells in the memory array. The capacitor 21 in the storage cell is disposed above the transistor in the third direction D3, and is electrically connected to the second source/drain region 15 in the transistor. The semiconductor structure further includes a common electrode 22. The common electrode 22 is disposed above the memory array in the third direction D3, and is electrically connected to the upper electrode layers of all the capacitors in the memory array. Certainly, in other words, the upper electrode layers of the capacitors 21 of all the storage cells in the memory array are integrally molded to form the foregoing common electrode 22.

In some embodiments, a plurality of first word lines 11 are arranged at intervals in the second direction D2, and a plurality of second word lines 12 are arranged at intervals in the first direction D1.

In some embodiments, the distance between adjacent first word lines 11 is equal to the distance between adjacent second word lines 12, and the first word line 11 has the same shape and size as the second word line 12. In such case, a plurality of first word lines 11 and a plurality of second word lines 12 can be formed by using a same mask, thereby further reducing the number of masks and reducing the manufacturing costs of the semiconductor structure.

In some embodiments, the materials of the first channel region and the second channel region are the same, and the first channel region and the second channel region are symmetrically arranged with respect to the common source/drain region 13. For example, the first channel region and the second channel region are symmetrically arranged with respect to an axis that passes through the center of the common source/drain region 13 and that extends in the first direction D1, so that the gate threshold voltage of the first channel region is the same as the gate threshold voltage of the second channel region, thereby simplifying the manufacturing process of the semiconductor structure, and simplifying the control operation of the semiconductor structure.

In some embodiments, the semiconductor structure further includes: a sense amplifier, disposed outside the memory array and electrically connected to the common bit line 19. In some embodiments, only one sense amplifier electrically connected to the common bit line 19 may be disposed. Consequently, this greatly reduces the internal space of the semiconductor structure and contributes to further downsizing of the semiconductor structure.

This invention further provides a method for forming a semiconductor structure. FIG. 4 is a flowchart of a method for forming a semiconductor structure according to some embodiments of the present invention. FIG. 5 to FIG. 10 are schematic diagrams of main process structures during formation of a semiconductor structure according to some embodiments of the present invention. For schematic diagrams of a semiconductor structure formed in some embodiments, references can be made to FIG. 1 to FIG. 3. As shown in FIG. 1 to FIG. 10, the method for forming a semiconductor structure includes the following steps:

Step S41: Provide an initial substrate.

Step S42: Etch the initial substrate to form an active array and a substrate 10 disposed below the active array, where the active array includes a plurality of active pillars 50 arranged in a first direction D1 and a second direction D2, the active pillar 50 includes a first channel region 51 and a second channel region 52 that are arranged at intervals in a third direction D3, as shown in FIG. 5, both the first direction D1 and the second direction D2 are parallel to a top surface of the substrate 10, the first direction D1 intersects the second direction D2, the third direction D3 is perpendicular to the top surface of the substrate 10, and all the active pillars 50 in the active array are electrically connected to a common bit line 19.

Figure 10:
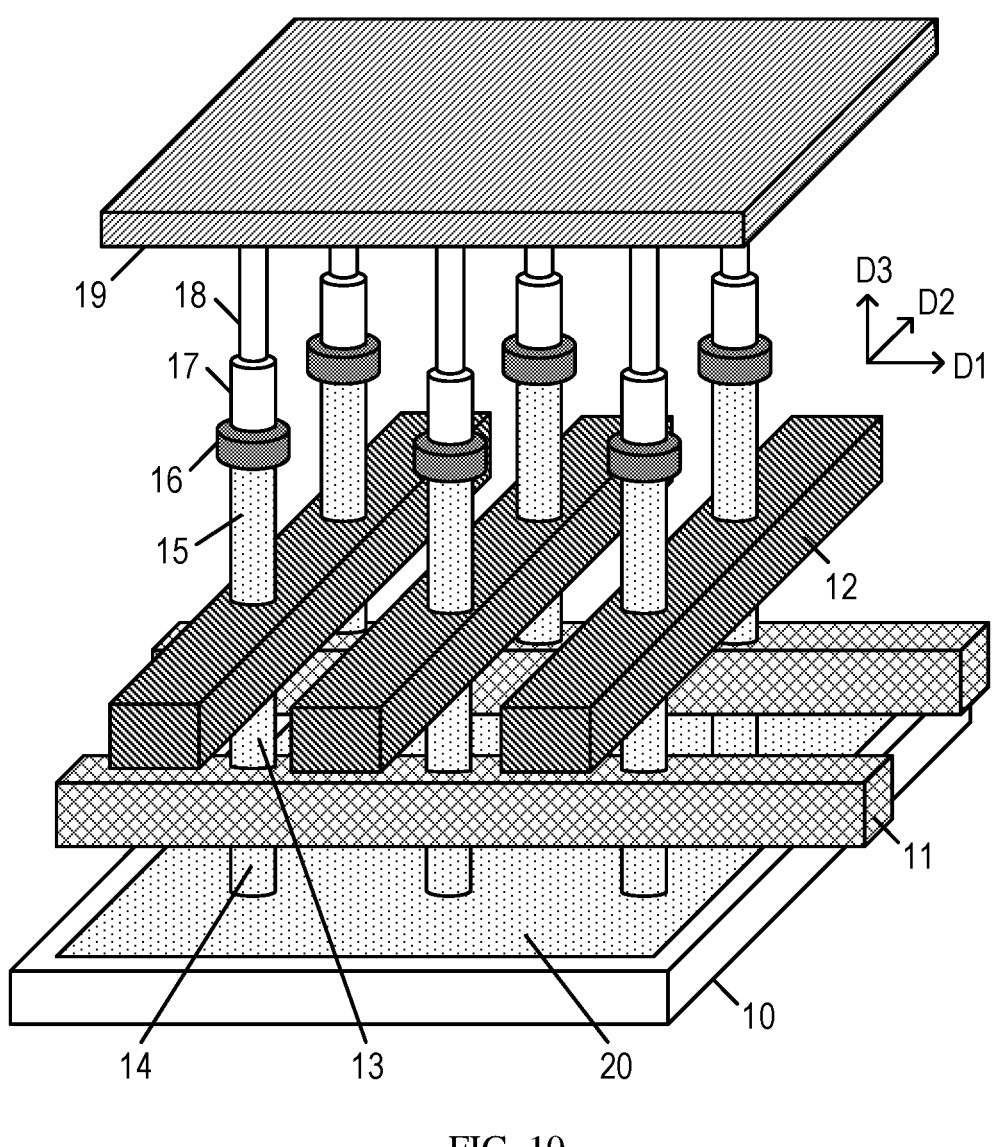

Step S43: Form a word line structure on the substrate 10, where the word line structure includes a first word line 11 extending in the first direction D1 and a second word line 12 extending in the second direction D2, the first word line 11 covers the first channel regions of the plurality of active pillars 50 that are arranged at intervals in the first direction D1, and the second word line 12 covers the second channel regions of the plurality of active pillars 50 that are arranged at intervals in the second direction D2, as shown in FIG. 10.

Figure 5:
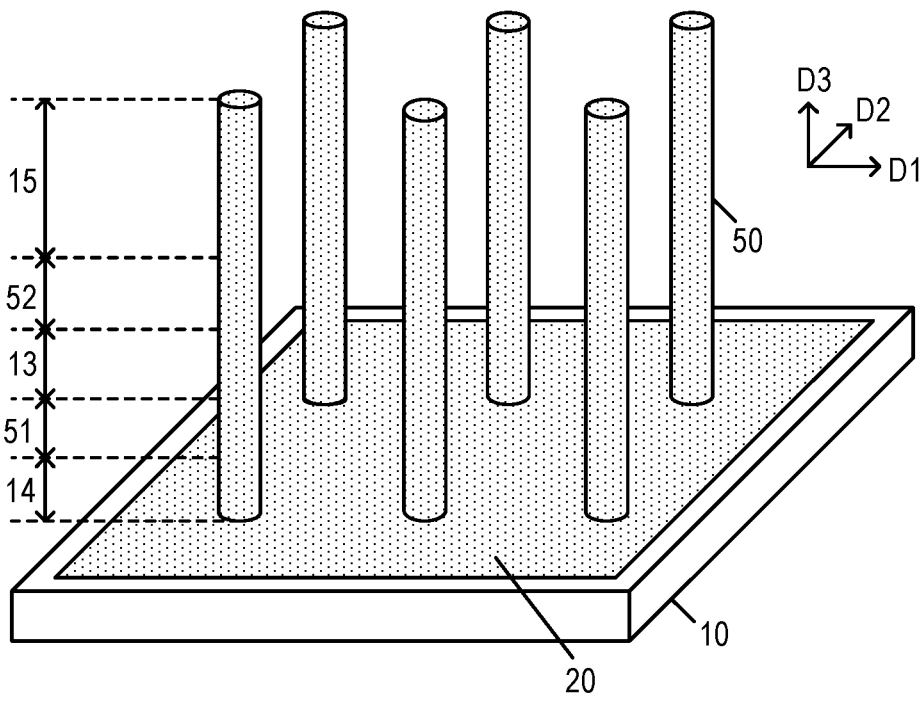
FIG. 5 to FIG. 10 are schematic diagrams of main process structures during formation of a semiconductor structure according to some embodiments of the present invention.

In some embodiments, forming the active array includes: etching the initial substrate to form a plurality of first trenches that extend in the first direction D1 and are arranged at intervals in the second direction D2, and a plurality of second trenches that extend in the second direction D2 and are arranged at intervals in the first direction D1, where the plurality of first trenches and the plurality of second trenches define, on the initial substrate, the plurality of active pillars 50 arranged in the first direction D1 and the second direction D2, as shown in FIG. 5.

In some embodiments, the active pillar 50 includes a common source/drain region 13 disposed between the first channel region 51 and the second channel region 52, a first source/drain region 14 disposed on a side of the first channel region 51 away from the common source/drain region 13, and a second source/drain region 15 disposed on a side of the second channel region 52 away from the common source/drain region 13, and the second source/drain region 15 is disposed above the first source/drain region 14 in the third direction D3. Forming the word line structure on the substrate 10 includes: filling a first isolation material in the first trenches and the second trenches to form a first isolation layer that fills the first trenches and the second trenches; etching back the first isolation layer to form a plurality of third trenches that extend in the first direction D1 and are arranged at intervals in the second direction D2, where the third trenches expose the first channel regions of the active pillars of a plurality of storage cells that are arranged at intervals in the first direction D1; forming a first gate dielectric layer wrapping the first channel region 51 along the third trench, and forming the first word line 11 covering the first gate dielectric layer; forming a second isolation layer that covers the first word line 11 and fills the third trenches; etching back the second isolation layer to form a plurality of fourth trenches that extend in the second direction D2 and are arranged at intervals in the first direction D1, where the fourth trenches expose the second channel regions 52 of the active pillars of a plurality of storage cells that are arranged at intervals in the second direction D2; forming a second gate dielectric layer wrapping the second channel region 52 along the fourth trench, and forming the second word line 12 covering the second gate dielectric layer; and forming a third isolation layer that covers the second word line 12 and fills the fourth trenches.

In some embodiments, after forming the word line structure on the substrate 10, the method further includes the following step: forming a storage element above the second source/drain region 15, where the storage element is electrically connected to the second source/drain region 15.

In some embodiments, forming the storage element above the second source/drain region 15 includes: forming, on the second source/drain region 15, a first end that is electrically connected to the second source/drain region 15; and forming a second end above the first end to form the storage element including the first end and the second end, where the second end is configured to electrically connect to a common bit line 19 (references are made to FIG. 10).

Figure 8:
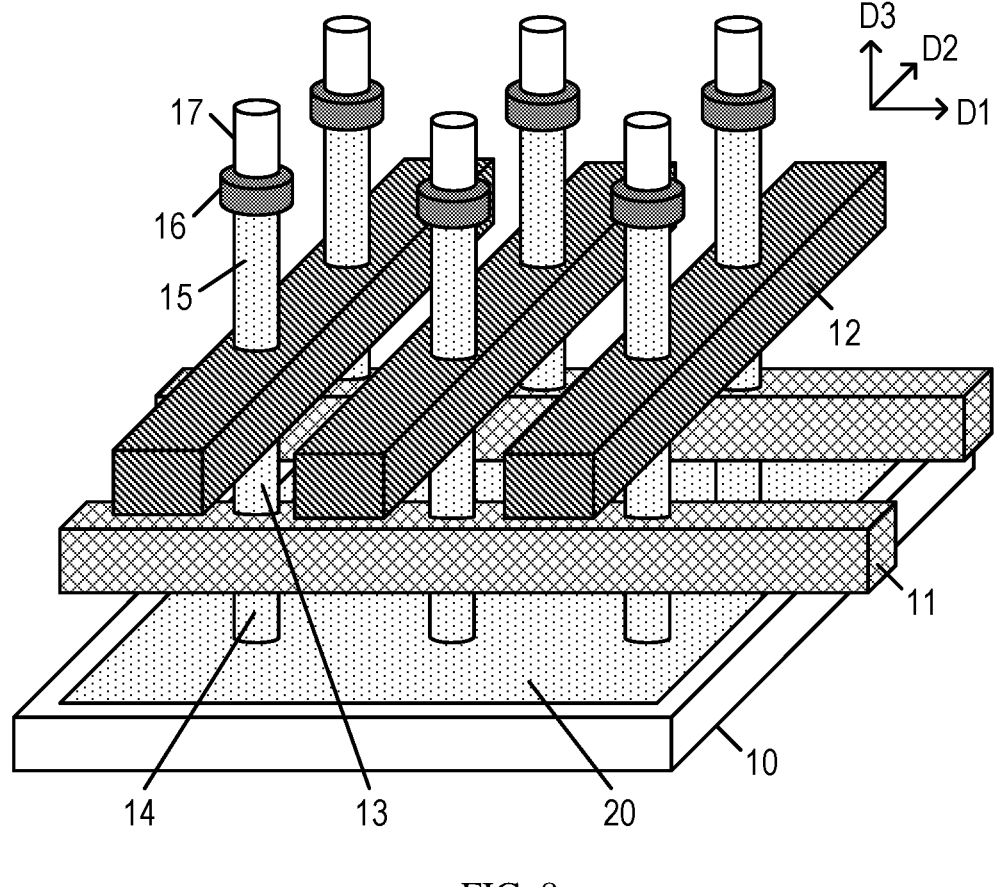

In some embodiments, before forming, on the second source/drain region 15, the first end that is electrically connected to the second source/drain region 15, the method further includes: forming a bottom contact electrode 16 covering the second source/drain region 15, as shown in FIG. 8, where the bottom contact electrode 16 covers the second source/drain region 15.

In some embodiments, after forming the storage element above the second source/drain region 15, the method further includes the following step: forming, above the storage element in the third direction D3, the common bit line 19 electrically connected to the second end of the storage element.

Figure 9:
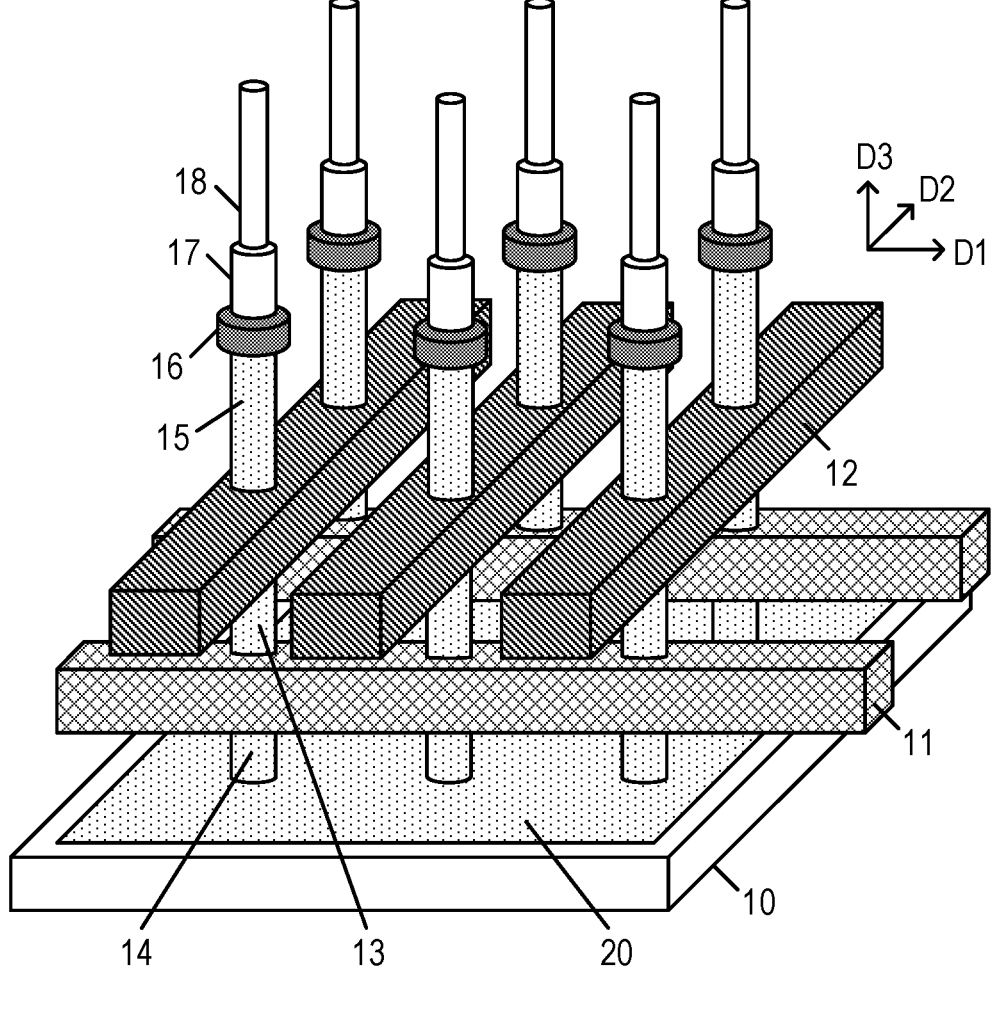

In some embodiments, forming, above the storage element in the third direction D3, the common bit line 19 electrically connected to the second end of the storage element includes: forming a bit line contact plug 18 above the second end of each storage element, as shown in FIG. 9; and forming the common bit line 19 that is electrically connected to all bit line plugs 18 and is in a flat plate shape, where the projection of the common bit line 19 in the flat plate shape on the top surface of the substrate 10 covers the projection of the active array on the top surface of the substrate 10, as shown in FIG. 10.

In some embodiments, forming the memory array, the word line structure, and the common bit line 19 on the substrate 10 further includes: forming a common source line 20 in a flat plate shape below the active array, where the common source line 20 is electrically connected to the first source/drain region 14, and the projection of the common source line 20 in the flat plate shape on the top surface of the substrate 10 covers the projection of the active array on the top surface of the substrate 10.

In some embodiments, forming the active array and the substrate 10 disposed below the active array includes: etching the initial substrate to form the plurality of first trenches and the plurality of second trenches, where the plurality of first trenches and the plurality of second trenches define, on the initial substrate, the plurality of active pillars 50 arranged in the first direction D1 and the second direction D2, a portion of the initial substrate remaining below the active pillars is configured as the common source line 20, and a portion of the initial substrate remaining below the common source line 20 is configured as the substrate 10.

The following description is based on an example in which the semiconductor structure is an MRAM, and the storage element is a magnetic tunnel junction. A photolithography process may be used to etch the initial substrate to form a plurality of first trenches that extend in the first direction D1 and are arranged at intervals in the second direction D2, and a plurality of second trenches that extend in the second direction D2 and are arranged at intervals in the first direction D1, where the plurality of first trenches and the plurality of second trenches define, on the initial substrate, the plurality of active pillars 50 arranged in an array in the first direction D1 and the second direction D2, to form an active array, as shown in FIG. 5. The depths of the first trenches and the second trenches in the third direction D3 are basically the same, and neither the first trenches nor the second trenches penetrate the initial substrate. Therefore, a portion of the initial substrate remaining below the active array, the first trenches, and the second trenches after doping may be configured as the common source line 20, and the initial substrate remaining below the common source line 20 is configured as the substrate 10, as shown in FIG. 5.

Figure 6:
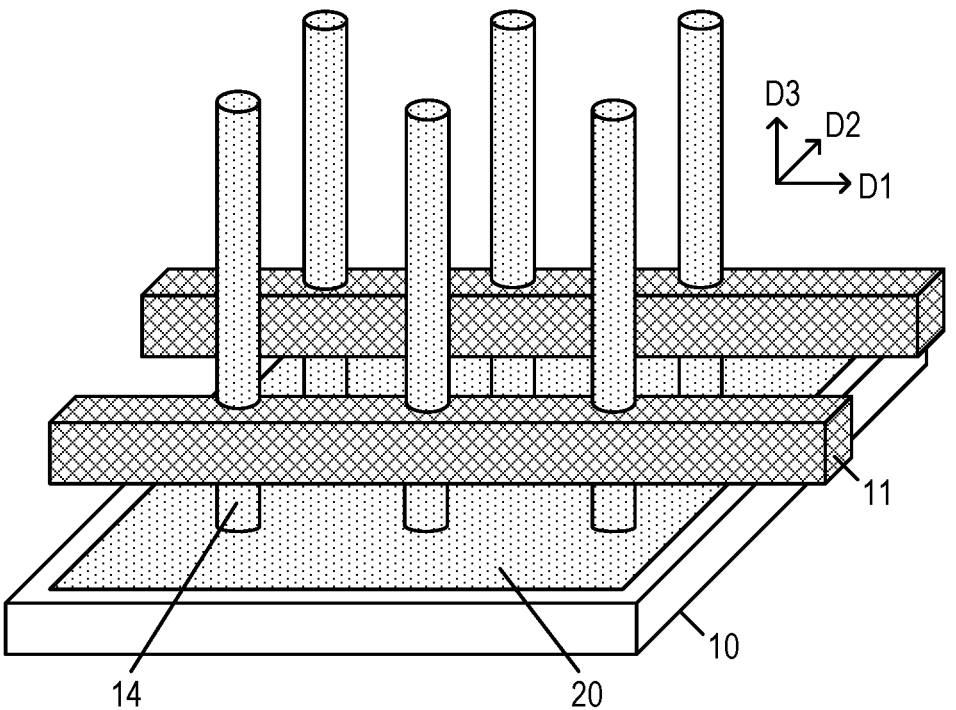
Figure 7:
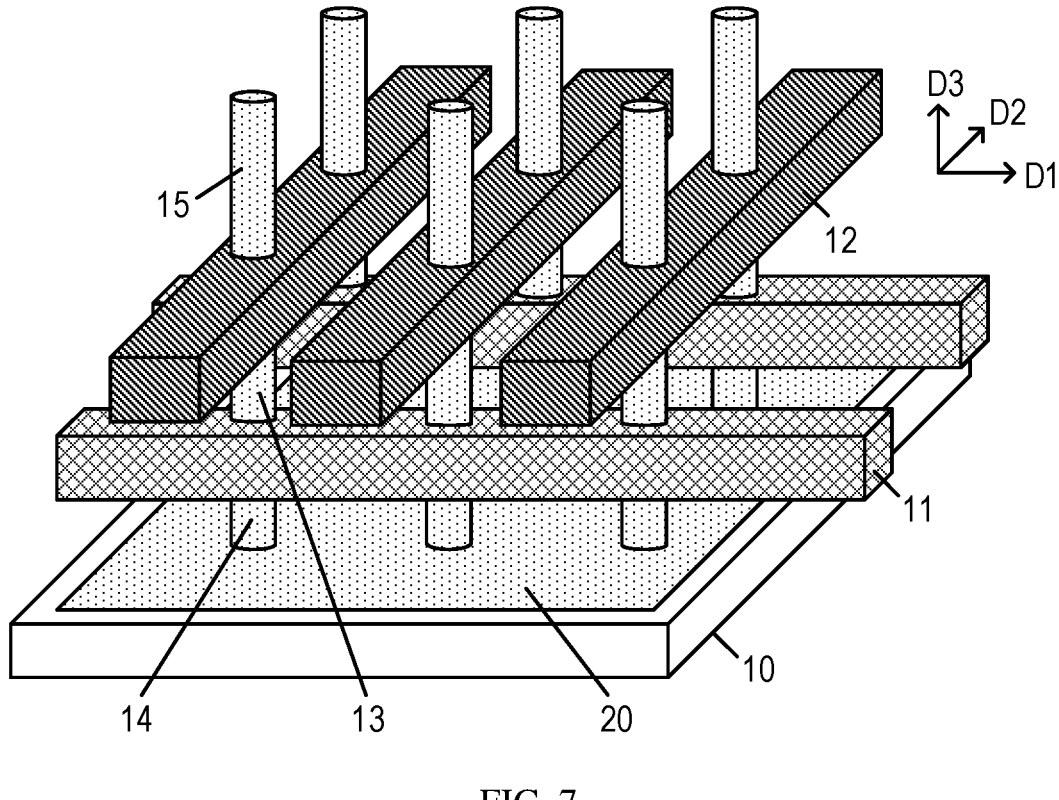

After the active array is formed, a first isolation material such as a spin-on dielectric material (SOD) may be filled in the first trenches and the second trenches to form a first isolation layer that fills the first trenches and the second trenches. Then, an etch-back process is used to remove a portion of the first isolation layer to form a plurality of third trenches that extend in the first direction D1 and are arranged at intervals in the second direction D2. The third trenches expose all the first channel regions 51 in the active pillar 50, and a remaining isolation layer covers the common source line 20 and the first source/drain region 14, and fills a portion of the first trenches and a portion of the second trenches. In some embodiments, the width of the third trench in the second direction D2 is greater than the width of the first trench in the second direction D2, so that all of the first channel regions 51 in the active pillar 50 are exposed. The remaining first isolation layer may be configured to isolate adjacent third trenches, thereby simplifying the process of subsequently forming a first word line. Then, a first gate dielectric material layer wrapping the exposed active pillar 50 may be formed by using a deposition process or an in-situ growth process. The material of the first gate dielectric material layer is an oxide material (such as silicon dioxide). Then, a first word line material such as metal tungsten or TiN may be deposited by using a selective atomic layer deposition process to form a first word line material layer. Then, an etch-back process is used to remove a portion of the first word line material layer and a portion of the first gate dielectric material layer, and only the first gate dielectric material layer disposed on the first channel region 51 is retained. In addition, the top surface of the first word line material layer is disposed below the common source/drain region 13 to expose the common source/drain region 13, the second channel region 52, and the second source/drain region 15 in the active pillar 50. As shown in FIG. 6, the remaining first gate dielectric material layer covering the first channel region 51 is configured as the first gate dielectric layer, and the remaining first word line material layer is configured as the first word line 11. A portion, covering the surface of the first gate dielectric layer, of the first word line 11 is configured as a first gate of the first transistor. Then, a second isolation layer that covers the first word line 11 and fills the third trenches is formed. A portion of the second isolation layer is etched back to form a plurality of fourth trenches that extend in the second direction D2 and are arranged at intervals in the first direction D1. The fourth trenches expose the second channel regions 52. In some embodiments, the width of the fourth trenches in the first direction D1 is greater than the width of the second trenches in the first direction D1, so that all of the second channel regions 52 in the active pillar 50 are exposed. Then, a second gate dielectric material layer wrapping the exposed active pillar 50 may be formed by using a deposition process or an in-situ growth process. The material of the second gate dielectric material layer is an oxide material (such as silicon dioxide). Then, a second word line material such as metal tungsten or TiN may be deposited by using a selective atomic layer deposition process, to form a second word line material layer. Then, an etch-back process is used to remove a portion of the second word line material layer and a portion of the second gate dielectric material layer, and only the second gate dielectric material layer disposed on the second channel region 52 is retained. In addition, the top surface of the second word line material layer is disposed below the second source/drain region 15 to expose the second source/drain region 15 in the active pillar 50. As shown in FIG. 7, the remaining second gate dielectric material layer covering the second channel region 52 is configured as the second gate dielectric layer, and the remaining second word line material layer is configured as the second word line 12. A portion, covering a surface of the second gate dielectric layer, of the second word line 12 is configured as a second gate of the second transistor. Finally, a third isolation layer that covers the second word line 12 and fills the fourth trenches is formed. It should be noted that the method for forming a word line structure is not limited thereto. For example, after an active array is formed, a gate dielectric layer wrapping the exposed active pillar 50 may be formed by using a deposition process or an in-situ growth process. A first isolation layer that fills the first trenches and the second trenches is formed, and the first isolation layer is etched back to form third trenches. A first word line material layer is formed in the third trenches, and the first word line material layer is etched back to obtain a first word line 11. A second isolation layer that covers the first word line 11 and fills the third trenches is formed, and the second isolation layer is etched back to form fourth trenches. A second word line material layer is formed in the fourth trenches, and the second word line material layer is etched back to obtain a second word line 12. A third isolation layer that covers the second word line 12 and fills the fourth trenches is formed. Certainly, in such case, before the bottom contact electrode 16 is formed above the second source/drain region 15 of the active pillar 50, the gate dielectric layer on the top surface of the active pillar 50 needs to be first removed.

The bottom contact electrode 16, the magnetic tunnel junction element 17 disposed on the bottom contact electrode 16, and the bit line contact plug 18 disposed on the magnetic tunnel junction element 17 are formed above the second source/drain region 15 of the active pillar 50, as shown in FIG. 8 and FIG. 9. Then, a conductive material such as metal tungsten or TiN is deposited above the bit line contact plug 18 to form a common bit line 19 in a flat plate shape, and the common bit line 19 is electrically connected to all the bit line contact plugs 18 at the same time.

In some embodiments, as shown in FIG. 3, the storage element is a capacitor 21; and forming the active array and the substrate 10 disposed below the active array further includes: etching the initial substrate to form a plurality of first trenches and a plurality of second trenches, where the plurality of first trenches and the plurality of second trenches define, on the initial substrate, the plurality of active pillars arranged in the first direction and the second direction, a portion of the initial substrate remaining below the active pillars forms the common bit line 19 in a flat plate shape, the common bit line 19 is electrically connected to the first source/drain region 14, and the projection of the common bit line 19 in the flat plate shape on the top surface of the substrate 10 covers the projection of the active array on the top surface of the substrate 10.

The following description is based on an example in which the semiconductor structure is a DRAM. For example, a photolithography process may be used to etch the initial substrate to form a plurality of first trenches that extend in the first direction D1 and are arranged at intervals in the second direction D2, and a plurality of second trenches that extend in the second direction D2 and are arranged at intervals in the first direction D1, where the plurality of first trenches and the plurality of second trenches define, on the initial substrate, the plurality of active pillars 50 arranged in an array in the first direction D1 and the second direction D2, to form an active array, as shown in FIG. 5. The depths of the first trenches and the second trenches in the third direction D3 are basically the same, and neither the first trenches nor the second trenches penetrate the initial substrate. Therefore, a portion of the initial substrate remaining below the active array is configured as the common bit line 19, and the initial substrate remaining below the common bit line 19 is configured as the substrate 10, as shown in FIG. 3. In some embodiments, the depths of the first trenches and the second trenches in the third direction D3 are the same. On the one hand, the manufacturing process of the semiconductor structure may be simplified, and the manufacturing difficulty of the semiconductor structure may be lowered. On the other hand, the consistency of performance in all directions of the active pillar can be further ensured, thereby improving electrical performance of the semiconductor structure.

After the first word line 11 and the second word line 12 are formed (the method for forming the first word line 11 and the second word line 12 may be the same as that for the MRAM), the capacitor 21 is formed on the second source/drain region 15 in the active pillar 50. The capacitor 21 includes a lower electrode layer electrically connected to the second source/drain region 15, a dielectric layer covering the surface of the lower electrode layer, and an upper electrode layer covering the surface of the dielectric layer. Then, a common electrode 22 in a flat plate shape is formed above the capacitor 21, and the common electrode 22 is electrically connected to the upper electrode layers of all the capacitors.

In some embodiments, the material of the active pillar 50 is a silicon material including doped ions, and the ion doping concentration of the common source/drain region 13 is greater than each of the ion doping concentration of the first channel region 51 and the ion doping concentration of the second channel region 52.

In some other embodiments, the material of the active pillar 50 may alternatively be an oxide semiconductor material. The oxide semiconductor material may be any one of or a combination of at least two of $In_2O_3$ (indium oxide), ZnO (zinc oxide), IZO (indium zinc oxide), IGZO (indium gallium zinc oxide), IZTO (indium zinc tin oxide), and ZnON (zinc oxynitride). In some embodiments, the material of the active pillar is IGZO.

Figure 11:
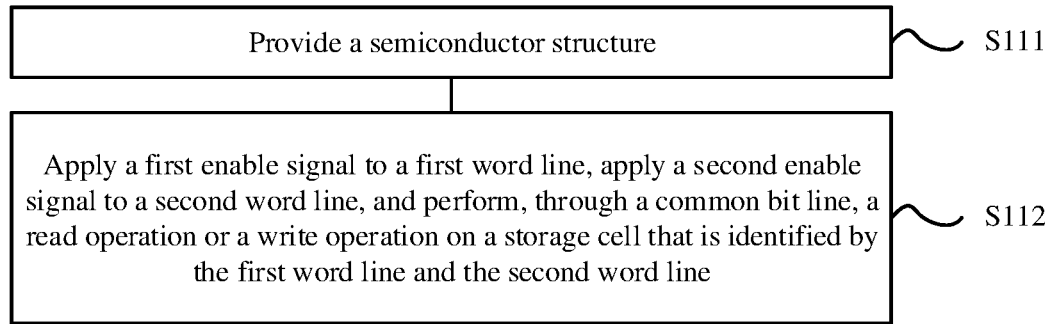
FIG. 11 is a flowchart of a method for operating a semiconductor structure according to some embodiments of the present invention.

This invention further provides a method for operating a semiconductor structure. FIG. 11 is a flowchart of a method for operating a semiconductor structure according to some embodiments of the present invention. The semiconductor structures shown in FIG. 1 to FIG. 3 may all be operated by using the method for operating a semiconductor structure according to some embodiments. As shown in FIG. 1, FIG. 2, and FIG. 11, the method for operating a semiconductor structure includes the following steps:

Step S111: Provide a semiconductor structure, where the semiconductor structure is shown in FIG. 1 and FIG. 2, or the semiconductor structure is shown in FIG. 3.

Step S112: Apply a first enable signal to a first word line 11, apply a second enable signal to a second word line 12, and perform, through the common bit line 19, a read operation or a write operation on a storage cell that is identified by the first word line 11 and the second word line 12.

The following description is based on an example in which the semiconductor structure is the MRAM shown in FIG. 1 and FIG. 2. A first enable signal is applied to one first word line 11 and a second enable signal is applied to one second word line 12. At the same time, a first disable signal is applied to other first word lines 11 and a second disable signal is applied to other second word lines 12. As such, a storage cell that is connected to the first word line 11 to which the first enable signal is applied, and at the same time, is connected to the second word line 12 to which the second enable signal is applied is identified, and a read operation or a write operation is performed on the identified storage cell.

According to the semiconductor structure and the forming method and operating method therefor provided in some embodiments of the present invention, a first channel region and a second channel region that are arranged at intervals in an extension direction of an active pillar of a storage cell are disposed in the active pillar, a word line structure including a first word line and a second word line is disposed, and each storage cell is connected to one first word line and one second word line, so that a position of a storage cell in a memory array can be determined by using the first word line and the second word line. Therefore, only one common bit line is disposed in the memory array, and all storage cells in the memory array are electrically connected through the common bit line. On the one hand, the manufacturing process of the bit line is simplified, and the contact area between the bit line and the storage cell is increased, thereby improving the electrical performance of the semiconductor structure. On the other hand, because only one common bit line is disposed, the number of sense amplifiers can be greatly reduced, and the area occupied by the sense amplifier can be reduced. Consequently, this improves the internal space utilization of the semiconductor structure and contributes to further downsizing of the semiconductor structure. In some other embodiments, a common source line in a flat plate shape may be formed, thereby further simplifying the manufacturing process of the semiconductor structure.

It should be noted that in the present invention, to simplify the illustration, some structures and/or film layers (for example, the first isolation layer, the second isolation layer, and the third isolation layer) are omitted from the accompanying drawings.

The foregoing descriptions are merely some exemplary implementations of the present invention. It should be noted that a person of ordinary skill in the art may further make some improvements and polishing without departing from the principle of the present invention. These improvements and polishing shall fall within the protection scope of the present invention.

What is claimed is:

1. A semiconductor structure, comprising:

a substrate;

a memory array, disposed on the substrate and comprising a plurality of storage cells arranged in a first direction and a second direction, wherein each storage cell comprises an active pillar, the active pillar comprises a first channel region and a second channel region that are arranged at intervals in a third direction, both the first direction and the second direction are parallel to a top surface of the substrate, the first direction intersects the second direction, and the third direction is perpendicular to the top surface of the substrate;

a word line structure, disposed on the substrate and comprising a first word line extending in the first direction and a second word line extending in the second direction, wherein the first word line covers the first channel regions of the active pillars of the plurality of storage cells that are arranged at intervals in the first direction, and the second word line covers the second channel regions of the active pillars of the plurality of storage cells that are arranged at intervals in the second direction; and a common bit line, disposed on the substrate and electrically connected to all the storage cells in the memory array.

2. The semiconductor structure according to claim 1, wherein the active pillar further comprises:

a common source/drain region, disposed between the first channel region and the second channel region;

a first source/drain region, disposed on a side of the first channel region away from the common source/drain region; and a second source/drain region, disposed on a side of the second channel region away from the common source/drain region.

3. The semiconductor structure according to claim 2, wherein a material of the active pillar is a semiconductor material comprising doped ions, and an ion doping concentration of the common source/drain region is greater than each of an ion doping concentration of the first channel region and an ion doping concentration of the second channel region.

4. The semiconductor structure according to claim 2, wherein the common bit line is in a flat plate shape, and a projection of the common bit line in the flat plate shape on the top surface of the substrate covers a projection of the memory array on the top surface of the substrate.

5. The semiconductor structure according to claim 2, wherein the second source/drain region is disposed above the first source/drain region in the third direction, and the storage cell further comprises:

a storage element, wherein the storage element is disposed above the second source/drain region and is electrically connected to the second source/drain region.

6. The semiconductor structure according to claim 5, wherein the common bit line is disposed above the memory array in the third direction, and the storage element comprises:

a first end, electrically connected to the second source/drain region; and a second end, disposed above the first end in the third direction, and electrically connected to the common bit line.

7. The semiconductor structure according to claim 6, wherein the storage cell further comprises:

a bottom contact electrode, disposed between and electrically connected to the first end and the second source/drain region, wherein the bottom contact electrode covers the second source/drain region.

8. The semiconductor structure according to claim 6, further comprising:

a common source line, disposed below the memory array in the third direction, wherein the first source/drain regions of all the storage cells in the memory array are electrically connected to the common source line.

9. The semiconductor structure according to claim 8, wherein the common source line is in a flat plate shape, and a projection of the common source line in the flat plate shape on the top surface of the substrate covers a projection of the memory array on the top surface of the substrate.

10. The semiconductor structure according to claim 5, wherein the storage element is a capacitor, and the common bit line is disposed below the memory array in the third direction; and the capacitor comprises:

a lower electrode layer, electrically connected to the second source/drain region;

a dielectric layer, covering a surface of the lower electrode layer; and an upper electrode layer, covering a surface of the dielectric layer.

11. The semiconductor structure according to claim 1, wherein a plurality of first word lines are arranged at intervals in the second direction, and a plurality of second word lines are arranged at intervals in the first direction.

12. The semiconductor structure according to claim 1, wherein the semiconductor structure further comprises:

a sense amplifier, disposed outside the memory array and electrically connected to the common bit line.

13. A method for forming a semiconductor structure, comprising:

providing an initial substrate;

etching the initial substrate to form an active array and a substrate disposed below the active array, wherein the active array comprises a plurality of active pillars arranged in a first direction and a second direction, each active pillar comprises a first channel region and a second channel region that are arranged at intervals in a third direction, both the first direction and the second direction are parallel to a top surface of the substrate, the first direction intersects the second direction, the third direction is perpendicular to the top surface of the substrate, and all the active pillars in the active array are electrically connected to a common bit line; and forming a word line structure on the substrate, wherein the word line structure comprises a first word line extending in the first direction and a second word line extending in the second direction, the first word line covers the first channel regions of the plurality of active pillars that are arranged at intervals in the first direction, and the second word line covers the second channel regions of the plurality of active pillars that are arranged at intervals in the second direction.

14. The method for forming a semiconductor structure according to claim 13, wherein forming the active array comprises:

etching the initial substrate to form a plurality of first trenches that extend in the first direction and are arranged at intervals in the second direction, and a plurality of second trenches that extend in the second direction and are arranged at intervals in the first direction, wherein the plurality of first trenches and the plurality of second trenches define, on the initial substrate, the plurality of active pillars arranged in the first direction and the second direction.

15. The method for forming a semiconductor structure according to claim 14, wherein the active pillar comprises a common source/drain region disposed between the first channel region and the second channel region, a first source/drain region disposed on a side of the first channel region away from the common source/drain region, and a second source/drain region disposed on a side of the second channel region away from the common source/drain region, and the second source/drain region is disposed above the first source/drain region in the third direction, and wherein forming the word line structure on the substrate comprises:

filling a first isolation material in the first trenches and the second trenches to form a first isolation layer that fills the first trenches and the second trenches;

etching back the first isolation layer to form a plurality of third trenches that extend in the first direction and are arranged at intervals in the second direction, wherein the third trenches expose the first channel regions of the active pillars of a plurality of storage cells that are arranged at intervals in the first direction;

forming a first gate dielectric layer wrapping the first channel region along the third trench, and forming the first word line covering the first gate dielectric layer;

forming a second isolation layer that covers the first word line and fills the third trenches;

etching back the second isolation layer to form a plurality of fourth trenches that extend in the second direction and are arranged at intervals in the first direction, wherein the fourth trenches expose the second channel regions of the active pillars of a plurality of storage cells that are arranged at intervals in the second direction; and forming a second gate dielectric layer wrapping the second channel region along the fourth trench, and forming the second word line covering the second gate dielectric layer.

16. The method for forming a semiconductor structure according to claim 15, after forming the word line structure on the substrate, further comprising:

forming a storage element above the second source/drain region, wherein the storage element is electrically connected to the second source/drain region.

17. The method for forming a semiconductor structure according to claim 16, wherein forming the storage element above the second source/drain region comprises:

forming, on the second source/drain region, a first end that is electrically connected to the second source/drain region; and forming a second end above the first end to form the storage element comprising the first end and the second end, wherein the second end is configured to electrically connect to the common bit line, wherein after forming the storage element above the second source/drain region, the method further comprises:

forming a bit line contact plug above the second end of each storage element;

forming the common bit line that is electrically connected to all bit line plugs and is in a flat plate shape, wherein a projection of the common bit line in the flat plate shape on the top surface of the substrate covers a projection of the active array on the top surface of the substrate; and forming a common source line in a flat plate shape below the active array, wherein the common source line is electrically connected to the first source/drain region, and a projection of the common source line in the flat plate shape on the top surface of the substrate covers the projection of the active array on the top surface of the substrate.

18. The method for forming a semiconductor structure according to claim 17, before forming, on the second source/drain region, the first end that is electrically connected to the second source/drain region, further comprising:

forming a bottom contact electrode covering the second source/drain region, wherein the bottom contact electrode is disposed between and electrically connected to the first end and the second source/drain region.

19. The method for forming a semiconductor structure according to claim 16, wherein the storage element is a capacitor, and forming the active array and the substrate disposed below the active array further comprises:

etching the initial substrate to form the plurality of first trenches and the plurality of second trenches, wherein the plurality of first trenches and the plurality of second trenches define, on the initial substrate, the plurality of active pillars arranged in the first direction and the second direction, a portion of the initial substrate remaining below the active pillars forms the common bit line in a flat plate shape, a portion of the initial substrate remaining below the common bit line is configured as the substrate, the common bit line is electrically connected to the first source/drain region, and a projection of the common bit line in the flat plate shape on the top surface of the substrate covers a projection of the active array on the top surface of the substrate.

20. A method for operating a semiconductor structure, comprising the following steps:

providing the semiconductor structure according to claim 1; and applying a first enable signal to a first word line, applying a second enable signal to a second word line, and performing, through the common bit line, a read operation or a write operation on a storage cell that is identified by the first word line and the second word line.

\* \* \* \* \*